United States Patent
Craig (10) Patent No.: US 11,874,335 B2
(45) Date of Patent: Jan. 16, 2024

(54) SYSTEM, APPARATUS, AND METHOD FOR TESTING OF AN ELECTRICAL SYSTEM

(71) Applicant: OneStep Power Solutions Inc., Houston, TX (US)

(72) Inventor: Mark Craig, Houston, TX (US)

(73) Assignee: OneStep Power Solutions Inc., Houston, TX (US)

( * ) Notice: Subject to any disclaimer, the term of this patent is extended or adjusted under 35 U.S.C. 154(b) by 508 days.

(21) Appl. No.: 17/102,654

(22) Filed: Nov. 24, 2020

(65) Prior Publication Data

US 2022/0163599 A1    May 26, 2022

(51) Int. Cl.
| | |
|---|---|
| *G01R 31/40* | (2020.01) |
| *G01R 31/28* | (2006.01) |
| *G01R 31/317* | (2006.01) |
| *H02J 1/00* | (2006.01) |

(52) U.S. Cl.
CPC ......... *G01R 31/40* (2013.01); *G01R 31/2812* (2013.01); *G01R 31/31721* (2013.01); *H02J 1/00* (2013.01)

(58) Field of Classification Search
CPC ................ G01R 31/40; G01R 31/2812; G01R 31/31721; H02J 1/00
See application file for complete search history.

(56) References Cited

U.S. PATENT DOCUMENTS

| | | | |
|---|---|---|---|
| 2004/0042145 A1* | 3/2004 | Garnett | H02J 1/108 361/115 |
| 2006/0132164 A1 | 6/2006 | Walker et al. | |
| 2015/0095734 A1 | 4/2015 | Chen et al. | |
| 2016/0054394 A1 | 2/2016 | Jouper | |
| 2016/0202302 A1* | 7/2016 | Cooper | G01R 31/086 324/503 |
| 2019/0257884 A1 | 8/2019 | Craig | |

* cited by examiner

*Primary Examiner* — Farhana A Hoque
(74) *Attorney, Agent, or Firm* — McCarter & English, LLP; James M. Smedley; Alex Korona (57) ABSTRACT

An apparatus configured to test an electrical system including one or more power supplies, a load, and one or more protective-isolation devices disposed between the one or more power supplies and the load is disclosed. The apparatus has a first measurement assembly configured to sense a first voltage or a first current at an input side of the one or more power supplies, a second measurement assembly configured to sense a second voltage or a second current at an output side of the one or more power supplies, and a third voltage or a third current between the one or more protective-isolation devices and the load, and a power controller electrically disposed between the second or third measurement assembly and a fault assembly. The fault assembly and the power controller are configured to selectively induce a fault, which is selected from a plurality of fault types, either to the output side of the electrical system or between the one or more protective-isolation devices and the load.

20 Claims, 6 Drawing Sheets

SYSTEM, APPARATUS, AND METHOD FOR TESTING OF AN ELECTRICAL SYSTEM

TECHNICAL FIELD

The present disclosure is directed to a system, apparatus, and method for testing, and more particularly, to a system, apparatus, and method for testing of an electrical system.

BACKGROUND OF THE DISCLOSURE

Direct current (DC) systems are used in many applications. For example, DC power is typically used in maritime industries such as involving vessels used in offshore drilling operations. Systems utilizing DC power are tested to confirm electrical fault isolation and to thereby confirm a safe operating status of a DC power system.

Conventional techniques for confirming fault isolation of DC systems typically utilize testing methods that may negatively affect or damage equipment components of the DC systems being tested. For example, conventional techniques may not be repeated without altering an operation of components being tested (e.g., conventional testing may alter the settings of a system being tested). Also, conventional testing techniques often involve personnel being in proximity or in contact with equipment being tested, which may expose testing personnel to unsafe conditions. Further, conventional testing systems are typically time-consuming and burdensome to prepare and perform testing.

The exemplary disclosed system and method of the present disclosure is directed to overcoming one or more of the shortcomings set forth above and/or other deficiencies in existing technology.

SUMMARY OF THE DISCLOSURE

In one exemplary aspect, the present disclosure is directed to an apparatus configured to test an electrical system including one or more power supplies, a load, and one or more protective-isolation devices disposed between the one or more power supplies and the load. The apparatus includes a first measurement assembly configured to sense a first voltage or a first current at an input side of the one or more power supplies, a second measurement assembly configured to sense a second voltage or a second current at an output side of the one or more power supplies, and a third voltage or a third current between the one or more protective-isolation devices and the load, and a power controller electrically disposed between the second or third measurement assembly and a fault assembly. The fault assembly and the power controller are configured to selectively induce a fault, which is selected from a plurality of fault types, either to the output side of the electrical system or between the one or more protective-isolation devices and the load.

In another aspect, the present disclosure is directed to a method for testing an electrical system including one or more power supplies, a load, and one or more protective-isolation devices disposed between the one or more power supplies and the load. The method includes sensing a first voltage or a first current at an input side of the one or more power supplies, sensing a second voltage or a second current at an output side of the one or more power supplies, sensing a third voltage or a third current between the one or more protective-isolation devices and the load, and selecting a fault from a plurality of fault types. The method also includes inducing the fault to the output side of the one or more power supplies or a load side of the one or more protective-isolation devices, and comparing a first data of the first voltage or the first current sensing, a second data of the second voltage or the second current sensing, and a third data of the third voltage or the third current sensing.

BRIEF DESCRIPTION OF THE DRAWINGS

Accompanying this written specification is a collection of drawings of exemplary embodiments of the present disclosure. One of ordinary skill in the art would appreciate that these are merely exemplary embodiments, and additional and alternative embodiments may exist and still within the spirit of the disclosure as described herein.

DETAILED DESCRIPTION AND INDUSTRIAL APPLICABILITY

The exemplary disclosed system, apparatus, and method may be used for testing of an electrical system. For example, the exemplary disclosed system, apparatus, and method may be used for confirming fault isolation of a power distribution system.

Figure 1:
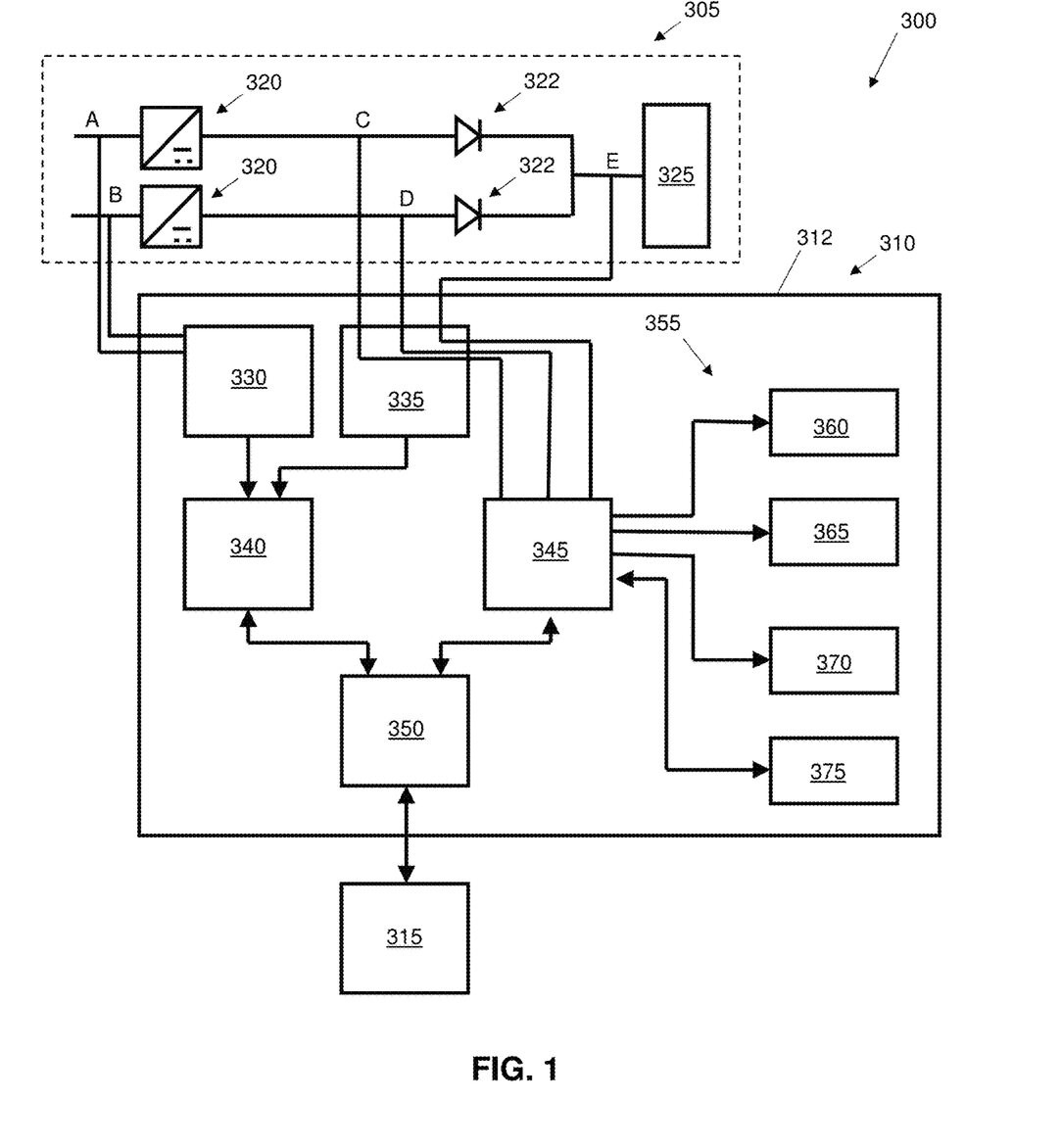
FIG. 1 is a schematic illustration of at least some exemplary embodiments of the present disclosure.

FIG. 1 illustrates an exemplary embodiment of the exemplary disclosed system, apparatus, and method. System 300 may include a power system 305, a testing apparatus 310, and a user interface 315. Testing apparatus 310 may be used to test power system 305. User interface 315 may communicate with testing apparatus 310 or may be an integral part of testing apparatus 310. System 300 may apply controlled voltage to power system 305 during the exemplary disclosed testing procedure described for example below.

Power system 305 may be any suitable electrical power system for distributing electrical power to one or more users or consumers. Power system 305 may be a direct current (DC) power system. Power system 305 may be a single or multi-fed DC power distribution system including single or multiple power supplies.

In at least some exemplary embodiments and as illustrated in FIG. 1, power system 305 may include a power supply 320 or a plurality of power supplies 320. Power supplies 320 may be DC power supplies such as low voltage DC power supplies. Power supplies 320 may be any suitable power supply such as, for example, power supplies for use in offshore drilling applications, vessels using dynamic positioning, maritime operations, power generation and distribution applications, and/or any other suitable application involving electrical power. Power supplies 320 may provide power to one or more power consumers 325 (e.g., a load such as equipment, vessels, machines, and/or any other suitable system, apparatus, or component utilizing electric power).

In at least some exemplary embodiments and as illustrated in FIG. 1, power system 305 may include a protective-isolation device (e.g., a protective and/or isolation device 322) or a plurality of protective-isolation devices (e.g., protective and/or isolation devices 322). Protective and/or isolation devices 322 may be any suitable device for protecting and/or isolating an electrical system such as, for example, a diode, a circuit breaker, a DC/DC converter, an isolated DC supply, an electronic circuit protective device, an electro-mechanical circuit breaker or fuse, or any other suitable protective and/or isolation device.

Testing apparatus 310 may include a first measurement assembly (e.g., an input measurement assembly 330), a second measurement assembly (e.g., an electrical measurement assembly 335), a data assembly 340, a power controller 345, a controller 350, and a fault assembly 355. Input measurement assembly 330 and electrical measurement assembly 335 may measure voltage and/or current of power system 305. Data assembly 340 may record data of the measurements made by input measurement assembly 330 and electrical measurement assembly 335. Power controller 345 may induce faults associated with power system 305 based on an operation of fault assembly 355. Controller 350 may control data assembly 340, power controller 345, and fault assembly 355. The exemplary disclosed components of testing apparatus 310 may be disposed partially or substantially entirely within a housing 312 or one or more housings 312 (e.g., "boxes" or other suitable structural housings) that support and house the components.

Testing apparatus 310 may be connected and/or installed with power system 305 as any of a temporary installation, a permanent installation, or an integrated installation. Regarding a temporary installation, electrical connectors of testing apparatus may be removably attached to power system 305 for example as illustrated in FIG. 1. For example, personnel may utilize testing apparatus 310 housed in one or more housings 312 to removably connect connectors of testing apparatus to power system 305 as illustrated in FIG. 1, prior to testing. Personnel may then remove the connectors of testing apparatus 310 from power system 305 following testing. Testing apparatus 310 may be for example a portable testing apparatus that may be moved between various testing locations using temporary installation at each testing location. Alternatively regarding permanent installation, testing apparatus 310 that may be housed in one or more housings 312 may remain co-located with and electrically connected to power system 305 permanently (e.g., remain permanently connected before, during, and after successive testing). Also alternatively regarding integrated installation, the exemplary disclosed components of testing apparatus 310 may be partially or substantially entirely integrated into a new or existing power system 305.

Input measurement assembly 330 may be any suitable assembly for measuring (e.g., capturing) voltage and/or current of power system 305. Input measurement assembly 330 may measure an input voltage and/or current of power system 305 for example at locations A and/or B (e.g., nodes A and/or B) as illustrated in FIG. 1. For example, locations A and B may be located at an input of one or more power supplies 320. Either alternating current (AC) or DC voltage and/or current may be measured by input measurement assembly 330. Input measurement assembly 330 may measure a first voltage and/or a first current (e.g., an input voltage and/or input current) at an input side of power system 305 (e.g., of one or more power supplies 320). Input measurement assembly 330 may measure the input voltage and current by any suitable technique such as, for example, differential voltage measurement, ground referenced voltage measurement, and/or any other suitable method. Input measurement assembly 330 may measure input voltage and current before, during, and after an exemplary disclosed test is performed. Input measurement assembly 330 may transfer data of voltage and current measurements to data assembly 340 for storage by data assembly 340 and for processing by controller 350.

Electrical measurement assembly 335 may be any suitable assembly for measuring (e.g., capturing) voltage and/or current of power system 305. Electrical measurement assembly 335 may measure an electrical voltage and/or current of power system 305 for example at locations C, D, and/or E (e.g., nodes C, D, and/or E) as illustrated in FIG. 1. For example, locations C and D may be located at an output of one or more power supplies 320. Also for example, location E may be located between any of protective and/or isolation devices 322 and power consumer 325. Electrical measurement assembly 335 may measure a second voltage and/or a second current (e.g., an electrical voltage and/or current) at an output side of power system 305 (e.g., of one or more power supplies 320). DC voltage and/or current may be measured by electrical measurement assembly 335. Electrical measurement assembly 335 may measure the DC voltage and current by any suitable technique such as, for example, differential voltage measurement, ground referenced voltage measurement, and/or any other suitable method. Electrical measurement assembly 335 may measure DC voltage and current before, during, and after an exemplary disclosed test is performed. Electrical measurement assembly 335 may transfer data of voltage and current measurements to data assembly 340 for storage by data assembly 340 and for processing by controller 350.

Data assembly 340 may be any suitable device for receiving, storing, and transferring data. Data assembly 340 may be a data storage. Data assembly 340 may be similar to the exemplary disclosed storage medium described below regarding FIG. 5. Data assembly 340 may be a data recording module that may record data collected by input measurement assembly 330 and/or electrical measurement assembly 335. Data assembly 340 may make the data available for external download for example via controller 350, user interface 315, and/or any suitable communication technique for example as described herein.

Controller 350 may control an operation of testing apparatus 310. Controller 350 may include for example a microprocessing logic control device or board components. Also for example, controller 350 may include input/output arrangements that allow it to be connected (e.g., via wireless and/or electrical connection) to other components of testing apparatus 310 (e.g., data assembly 340, power controller 345, user interface 315, input measurement assembly 330, and/or electrical measurement assembly 335). Controller 350 may communicate with other components of system 300 by any suitable communication technique (e.g., wire or wireless) for example as described herein. In at least some exemplary embodiments, controller 350 may be a microcontroller (MCU) chip that may include and process some or substantially all storage and instructions for performing the exemplary disclosed operations of testing apparatus 310. Controller 350 may be a controller module that compares the measurement data (e.g., readings) from input measurement assembly 330 and/or electrical measurement assembly 335 to determine if the exemplary disclosed testing results in a pass or a fail. Controller 350 may control power controller 345 to initiate a desired type of fault at a desired time. Controller 350 may operate based on instructions received from user interface 315. Controller 350 may also operate based on algorithms or other predetermined criteria, machine learning for example as described herein, and/or any other suitable criteria. Controller 350 may receive input from and provide output to user interface via direct communication (e.g., via user interface 315 that may be attached, box-mounted, or remotely located), WiFi, Bluetooth, and/or any other suitable communication technique for example as described herein. Controller 350 and any other suitable component (e.g., user interface 315, input measurement assembly 330, electrical measurement assembly 335, data assembly 340, power controller 345, and/or fault assembly 355) of system 300 may communicate with each other via any suitable communication method such as, for example, wireless communication (e.g., CDMA, GSM, 3G, 4G, and/or 5G), direct communication (e.g., wire communication such as electrical connector 365), Bluetooth communication coverage, Near Field Communication (e.g., NFC contactless communication such as NFC contactless methods), radio frequency communication (e.g., RF communication such as short-wavelength radio waves, e.g., UHF waves), and/or any other desired communication technique. Testing apparatus 310 may communicate with other devices as part of a system similar to for example as described herein regarding FIG. 6.

System 300 may include one or more modules that may be partially or substantially entirely integrated with one or more components of system 300 such as, for example, components of testing apparatus 310 such as controller 350, fault assembly 355, and/or data assembly 340. The one or more modules may be software modules as described for example below regarding FIG. 5. For example, the one or more modules may include computer-executable code stored in non-volatile memory. The one or more modules may also operate using a processor (e.g., controller 350). The one or more modules may store data (e.g., data assembly 340) and/or be used to control some or all of the exemplary disclosed processes described herein.

Power controller 345 may include components similar to as described above regarding controller 350. Power controller 345 may include any suitable electrical components for inducing a fault at power system 305. For example, power controller 345 may include fault induction equipment such as one or more noninvasive fault detection devices capable of inducing a fault for example as described below relating to fault assembly 355. For example, power controller 345 may include fault-inducing equipment for initiating variable load, earth fault, and/or short circuit conditions to one or multiple feeds (e.g., connected DC feeds) of power system 305.

Fault assembly 355 may include a plurality of software modules similar to for example as described above and/or fault-inducing hardware. Fault assembly 355 may include a variable load module 360, an earth fault module 365, a short circuit module 370, and a variable power supply 375. Fault assembly 355 and power controller 345 may operate to induce a fault at locations C, D, and/or E as illustrated in FIG. 1.

Variable load module 360 may include a software module and/or fault-inducing hardware for providing a plurality of different types of load to power system 305 via power controller 345. Variable load module 360 and power controller 345 may operate to provide a variable resistive, variable inductive, variable capacitive, and/or electronic load to power system 305 (e.g., at locations C, D, and/or E). Variable load module 360 and/or power controller 345 may include a variable resistive load module (e.g., including a plurality of resistors), a variable inductive load module (e.g., including a plurality of inductors), a variable capacitive load module (e.g., including a plurality of capacitors), and/or a variable electronic load module (e.g., a digital module).

Earth fault module 365 may include a software module and/or fault-inducing hardware for providing positive or negative to ground on power system 305 via power controller 345. In at least some exemplary embodiments, earth fault module 365 and power controller 345 may operate to apply positive and/or negative to ground on power system 305 (e.g., at locations C, D, and/or E).

Short circuit module 370 may include a software module and/or fault-inducing hardware for providing positive-to-negative or positive-to-negative-to-ground on power system 305 via power controller 345. In at least some exemplary embodiments, short circuit module 370 and power controller 345 may operate to apply positive-to-negative or positive-to-negative-to-ground on power system 305 (e.g., at locations C, D, and/or E).

Variable power supply 375 may be any suitable variable power supply such as a variable DC power supply. A user of system 300 may control variable power supply 375 via user interface 315, controller 350, and power controller 345 to provide a desired voltage and/or current (e.g., at locations C, D, and/or E) for use in the exemplary disclosed operation of system 300.

User interface 315 may be any suitable device for receiving input and/or providing output (e.g., raw data or other desired information) to a user of system 300. User interface 315 may be an external or internal human-machine interface device. User interface 315 may be, for example, a touchscreen device (e.g., a smartphone, a tablet, a smartboard, and/or any suitable computer device), a computer keyboard and monitor (e.g., desktop or laptop), an audio-based device for entering input and/or receiving output via sound, a tactile-based device for entering input and receiving output based on touch or feel, a dedicated user device or interface designed to work specifically with other components of system 300, and/or any other suitable user device or interface. For example, user interface 315 may include a touchscreen device of a smartphone or handheld tablet. For example, user interface 315 may include a display that may include a graphical user interface to facilitate entry of input by a user and/or receiving output. For example, system 300 may provide notifications to a user via output transmitted to user interface 315 (e.g., and/or other components of system 300). User interface 315 may also be any suitable accessory such as a smart watch, Bluetooth headphones, and/or other suitable devices that may communicate with components of system 300. User interface 315 may provide an interface for a user to select testing parameters, initiate tests, receive test results, provide feedback, and/or provide or receive any suitable input or output.

Figure 2:
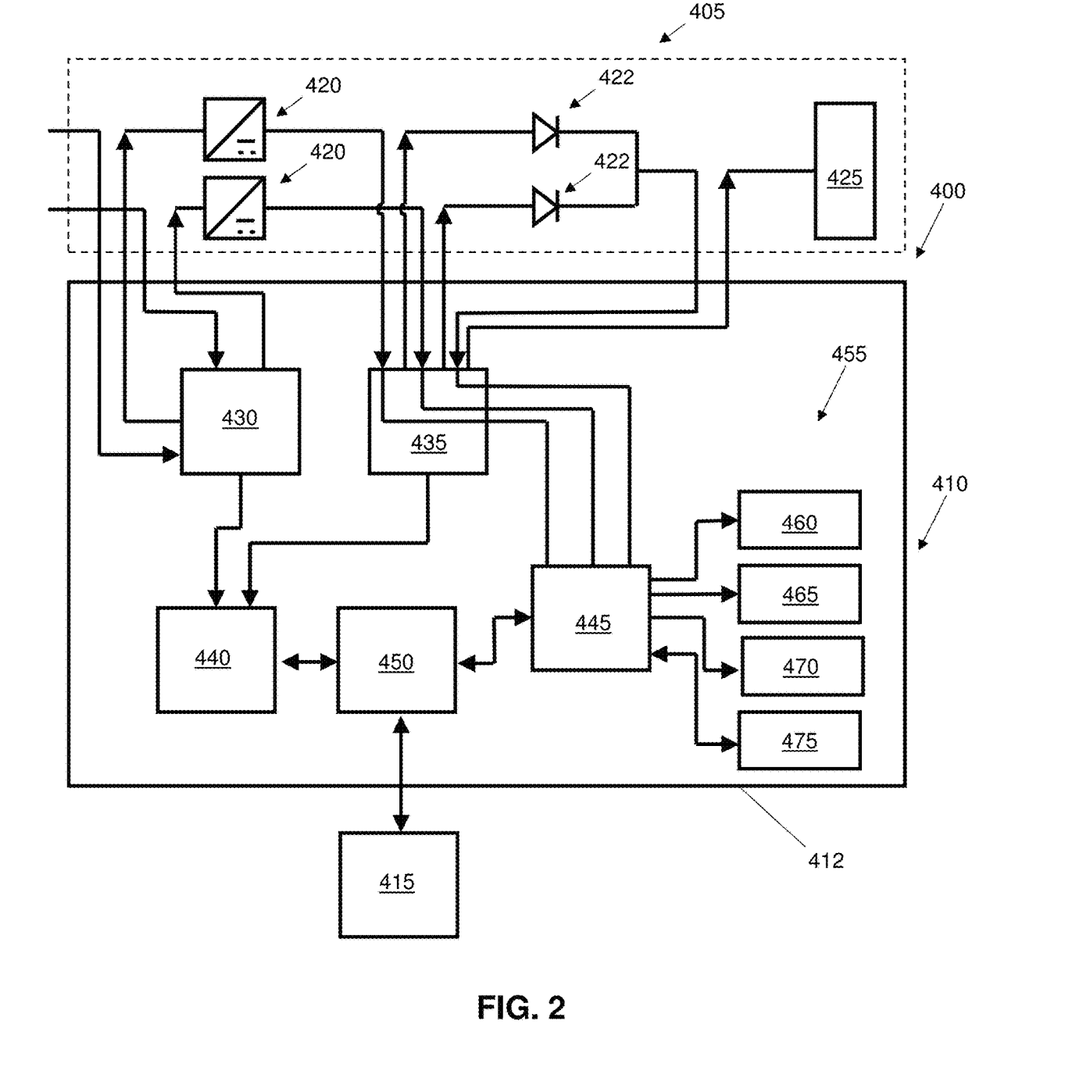
FIG. 2 is a schematic illustration of at least some exemplary embodiments of the present disclosure.

FIG. 2 illustrates another exemplary embodiment of the exemplary disclosed system, apparatus, and method. System 400 may include a power system 405 that may be similar to power system 305, a testing apparatus 410 that may be similar to testing apparatus 310, a housing 412 that may be similar to housing 312, a user interface 415 that may be similar to user interface 315, a power supply 420 that may be similar to power supply 320, a protective and/or isolation device 422 that may be similar to protective and/or isolation device 322, a power consumer 425 that may be similar to power consumer 325, an input measurement assembly 430 that may be similar to input measurement assembly 330, an electrical measurement assembly 435 that may be similar to electrical measurement assembly 335, a data assembly 440 that may be similar to data assembly 340, a power controller 445 that may be similar to power controller 345, a controller 450 that may be similar to controller 350, a fault assembly 455 that may be similar to fault assembly 355, a variable load module 460 that may be similar to variable load module 360, an earth fault module 465 that may be similar to earth fault module 365, a short circuit module 470 that may be similar to short circuit module 370, and a variable power supply 475 that may be similar to variable power supply 375. For example as illustrated in FIG. 2, system 400 may provide for pass through measurement or sensing (e.g., recording such as data recording) of power system 405 by testing apparatus 410. For example, input measurement assembly 430 and electrical measurement assembly 435 may be configured to provide for pass through recording of the testing of power system 405 for example as illustrated in FIG. 2. Testing apparatus 410 may be connected and/or installed with power system 405 as any of a temporary installation, a permanent installation, or an integrated installation similar to as described above regarding testing apparatus 310.

Figure 3:
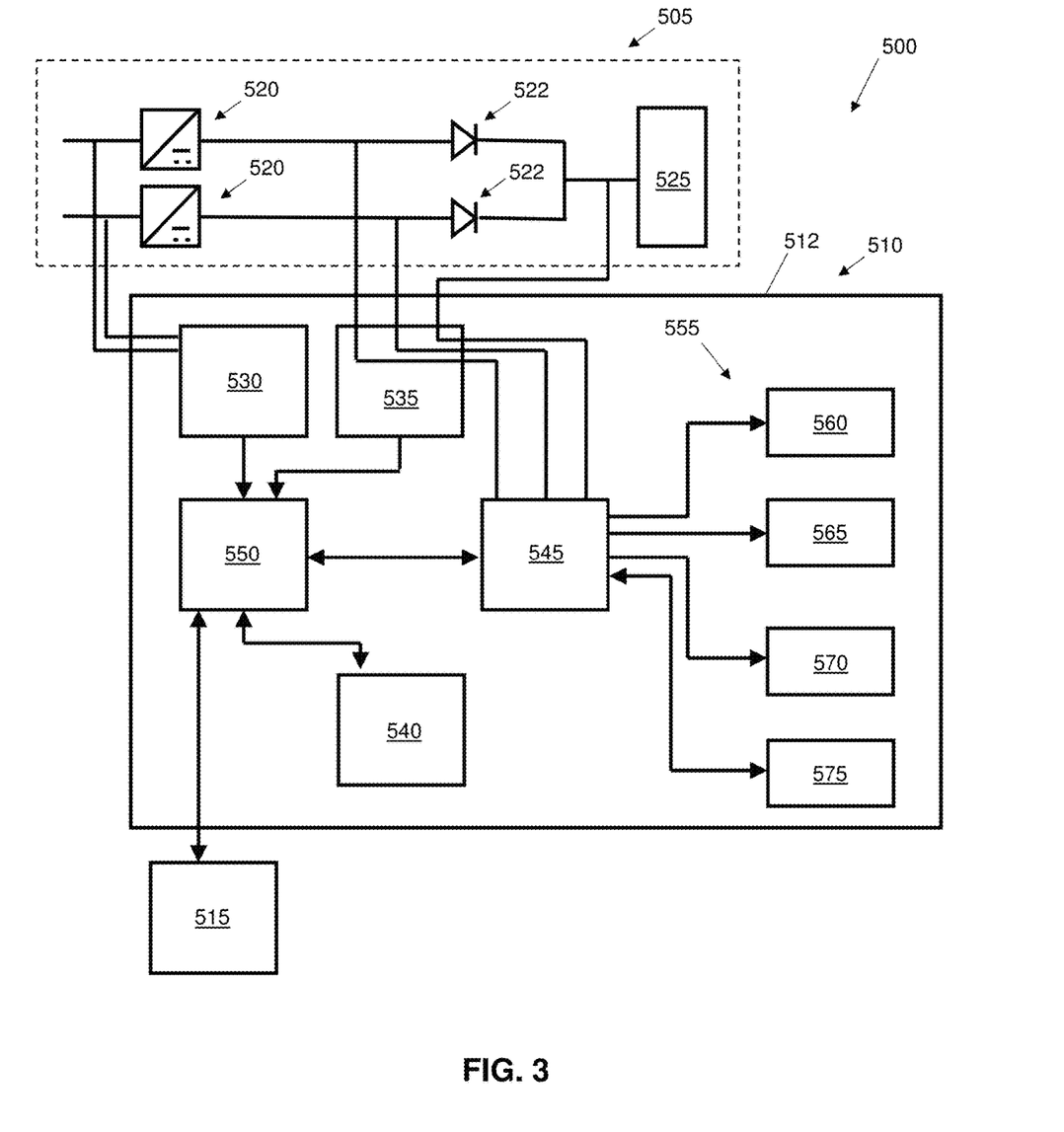
FIG. 3 is a schematic illustration of at least some exemplary embodiments of the present disclosure.

FIG. 3 illustrates another exemplary embodiment of the exemplary disclosed system, apparatus, and method. System 500 may include a power system 505 that may be similar to power system 305, a testing apparatus 510 that may be similar to testing apparatus 310, a housing 512 that may be similar to housing 312, a user interface 515 that may be similar to user interface 315, a power supply 520 that may be similar to power supply 320, a protective and/or isolation device 522 that may be similar to protective and/or isolation device 322, a power consumer 525 that may be similar to power consumer 325, an input measurement assembly 530 that may be similar to input measurement assembly 330, an electrical measurement assembly 535 that may be similar to electrical measurement assembly 335, a data assembly 540 that may be similar to data assembly 340, a power controller 545 that may be similar to power controller 345, a controller 550 that may be similar to controller 350, a fault assembly 555 that may be similar to fault assembly 355, a variable load module 560 that may be similar to variable load module 360, an earth fault module 565 that may be similar to earth fault module 365, a short circuit module 570 that may be similar to short circuit module 370, and a variable power supply 575 that may be similar to variable power supply 375. For example as illustrated in FIG. 3, system 500 may provide for controller-to-data recording during testing of power system 505 by testing apparatus 510. For example, controller 550 may be disposed in direct communication with each of input measurement assembly 530, electrical measurement assembly 535, data assembly 540, power controller 545, and user interface 515. Testing apparatus 510 may be connected and/or installed with power system 405 as any of a temporary installation, a permanent installation, or an integrated installation similar to as described above regarding testing apparatus 310.

The exemplary disclosed system, apparatus, and method may be used in any suitable application involving electrical systems. For example, the exemplary disclosed system, apparatus, and method may be used in any suitable application for performing testing of electrical systems. The exemplary disclosed system, apparatus, and method may be used in any suitable application involving DC power. The exemplary disclosed system, apparatus, and method may be used in any suitable application for confirming fault isolation of an electrical system. The exemplary disclosed system, apparatus, and method may be used in any suitable testing technique of a DC power system such as a DC power distribution system. The exemplary disclosed system, apparatus, and method may be used in any suitable industry or application such as, for example, offshore drilling applications, vessels using dynamic positioning, maritime operations, power generation and distribution applications, and/or any other suitable application involving electrical power.

Figure 4:
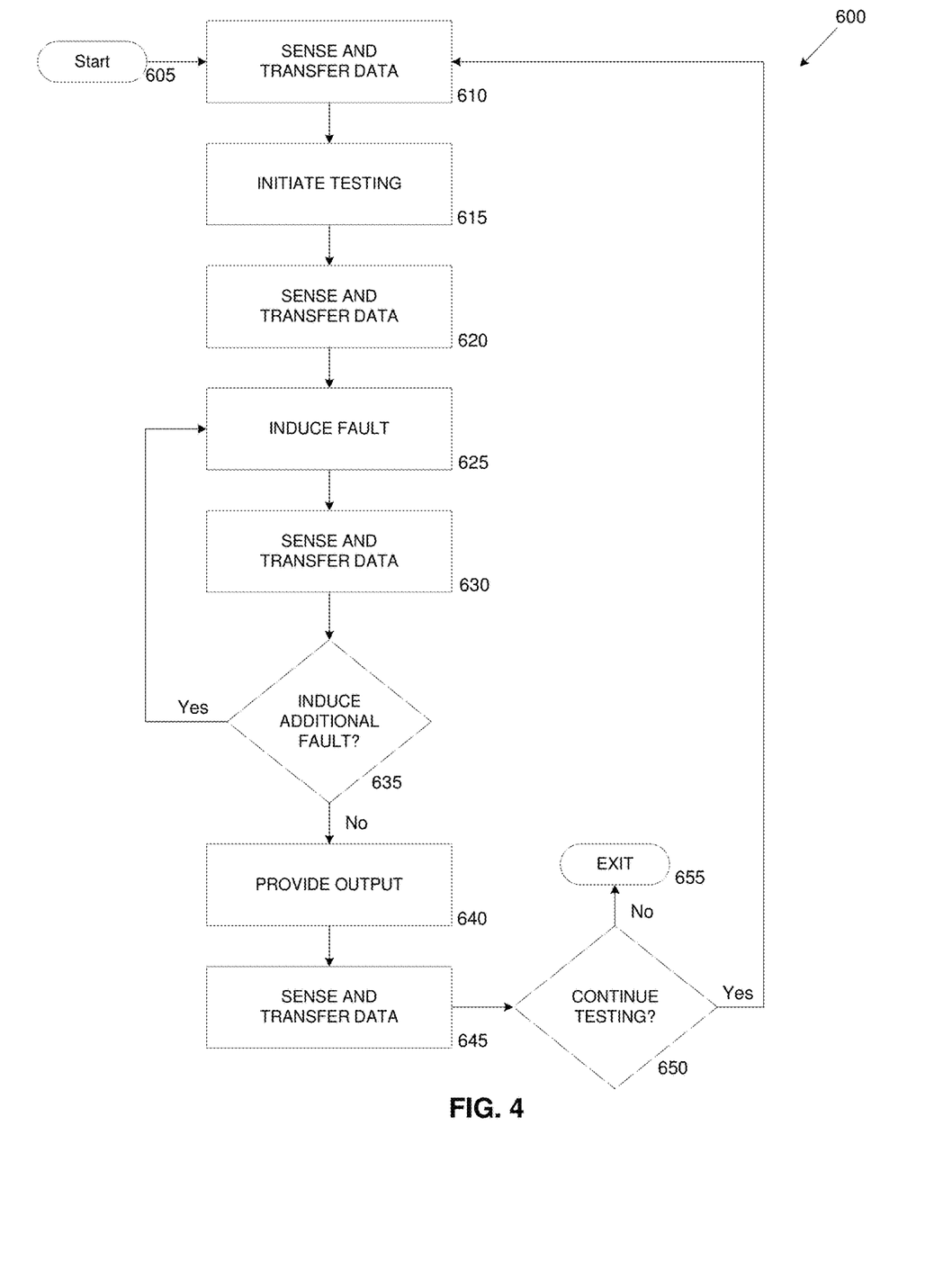
FIG. 4 illustrates an exemplary process of at least some exemplary embodiments of the present disclosure.

FIG. 4 illustrates an exemplary operation of the exemplary disclosed system. Process 600 may be an electrical testing method. Process 600 begins at step 605. At step 610, input measurement assembly 330 and electrical measurement assembly 335 may measure voltage and/or current of power system 305 (e.g., at locations A, B, C, D, and/or E) as described above. System 300 may operate to transfer the data collected by input measurement assembly 330 and electrical measurement assembly 335 to data assembly 340. The measured data may also be transferred as output data to a user via controller 350 and user interface 315. Testing apparatus 310 may thereby sense and transfer data prior to the exemplary disclosed testing. Controller 350 may access the data stored in data assembly 340 and use the data in computations for example as described herein.

At step 615, system 300 may initiate testing. For example, a user may provide input to controller 350 via user interface 315. Controller 350 may then control power controller 345 to control fault assembly 355 to initiate testing. In addition to user input provided via user interface 315, controller 350 may also control power controller 345 to initiate testing based on algorithms or other predetermined criteria, machine learning for example as described herein, and/or any other suitable criteria.

At step 620, input measurement assembly 330 and electrical measurement assembly 335 may measure voltage and/or current of power system 305 (e.g., at locations A, B, C, D, and/or E) and transfer the data to data assembly 340 and/or user interface 315 similar to step 610. Testing apparatus 310 may thereby sense and transfer data during the exemplary disclosed testing.

At step 625, testing apparatus 310 may induce a fault condition to power system 305. For example, variable load module 360 and power controller 345 may operate to provide a variable resistive, variable inductive, variable capacitive, and/or electronic load (e.g., at locations C, D, and/or E). Also for example, earth fault module 365 and power controller 345 may operate to apply either positive and/or negative to ground on power system 305 (e.g., at locations C, D, and/or E). Further for example, short circuit module 370 and power controller 345 may operate to apply positive-to-negative or positive-to-negative-to-ground on power system 305 (e.g., at locations C, D, and/or E).

At step 630, input measurement assembly 330 and electrical measurement assembly 335 may measure voltage and/or current of power system 305 (e.g., at locations A, B, C, D, and/or E) and transfer the data to data assembly 340 and/or user interface 315 similar to step 610. Testing apparatus 310 may thereby sense and transfer data during the exemplary disclosed testing.

At step 635, testing apparatus 310 may determine whether or not an additional fault is to be induced. A user may provide input to controller 350 via user interface 315 to instruct testing apparatus 310 to induce an additional fault. In addition to user input provided via user interface 315, controller 350 may also control power controller 345 to induce an additional fault based on algorithms or other predetermined criteria, machine learning for example as described herein, and/or any other suitable criteria. If an additional fault is to be provided, system 300 may return to step 625 to induce an additional fault condition and step 630 to sense and transfer data. System 300 may repeat steps 625 and 630 for as many iterations as desired.

At step 640, testing apparatus 310 may provide output to a user. Controller 350 may access measurement data stored in data assembly 340. Controller 350 may compare measurement data (e.g., readings) from input measurement assembly 330 and electrical measurement assembly 335. Based on comparing the data of input measurement assembly 330 and electrical measurement assembly 335 measured for example at the locations illustrated in FIG. 1, controller 350 may determine if the test of power system 305 results in a pass or a fail based on any suitable testing technique or criteria. For example, controller 350 may make any suitable calculations based on suitable algorithms, predetermined criteria, machine learning operations, and/or any other suitable criteria. Controller 350 may compare data (e.g., voltage and/or current measurement data) measured at any time before, during, and/or after testing at any of locations A, B, C, D, and/or E with data of any other of locations A, B, C, D, and/or E at any time before, during, and/or after testing. As one of many possible examples, data measured at location A measured during testing may be compared by controller 350 with data measured at locations C and E before testing, locations B, D, and E during testing, and locations A, B, and D after testing. Also as one of many possible examples, data measured at location E before testing may be compared with data measured at locations A, B, C, and D before testing, data measured at locations A, B, C, D, and E during testing, and data measured at location C after testing. Controller 350 may transfer output data to user interface 315 via any suitable communication technique for example as described herein.

At step 645, input measurement assembly 330 and electrical measurement assembly 335 may measure voltage and/or current of power system 305 (e.g., at locations A, B, C, D, and/or E) and transfer the data to data assembly 340 and/or user interface 315 similar to step 610. Testing apparatus 310 may thereby sense and transfer data following the exemplary disclosed testing.

At step 650, testing apparatus 310 may determine whether or not testing is to be continued. A user may provide input to controller 350 via user interface 315 to instruct testing apparatus 310 to continue testing. In addition to user input provided via user interface 315, controller 350 may also control power controller 345 to continue testing based on algorithms or other predetermined criteria, machine learning for example as described herein, and/or any other suitable criteria. If testing is to be continued, system 300 may return to step 610, and steps 610 through 645 may be repeated. System 300 may repeat steps 610 through 645 for as many iterations as desired. If testing is not to be continued, process 600 ends at step 655.

System 400 may operate generally similarly to as described above regarding system 300. System 400 may provide for pass through recording of the testing of power system 405 by testing apparatus 410 as illustrated in FIG. 2.

System 500 may operate generally similarly to as described above regarding system 300. System 500 may provide for controller-to-data recording during testing of power system 505 by testing apparatus 510 as illustrated in FIG. 3.

In at least some exemplary embodiments, the exemplary disclosed system, apparatus, and method may be used to test a low voltage DC power distribution system, which may have single or multiple DC power supplies, to verify that faults do not propagate to a supply side of the DC power supply unit or units. The exemplary disclosed apparatus may include single or multiple housings (e.g., boxes) containing a processor, data capture equipment, and fault-inducing equipment. The exemplary disclosed system, apparatus, and method may automatically verify that some or substantially any faults induced on an output side of the one or more DC power supplies do not propagate to an input side of the one or more DC power supplies (e.g., and may alert a user such as an operator of any faults that may propagate to the input side).

In at least some exemplary embodiments, the exemplary disclosed apparatus may be configured to test an electrical system including one or more power supplies, a load, and one or more protective-isolation devices disposed between the one or more power supplies and the load. The exemplary disclosed apparatus may include a first measurement assembly (e.g., input measurement assembly 330, 430, or 530) configured to sense a first voltage or a first current at an input side of the one or more power supplies, a second measurement assembly (e.g., electrical measurement assembly 335, 435, or 535) configured to sense a second voltage or a second current at an output side of the one or more power supplies, and a third voltage or a third current between the one or more protective-isolation devices and the load, and a power controller (e.g., power controller 345, 445, or 545) electrically disposed between the second or third measurement assembly and a fault assembly. The fault assembly and the power controller may be configured to selectively induce a fault, which is selected from a plurality of fault types, either to the output side of the electrical system or between the one or more protective-isolation devices and the load. The one or more power supplies may be one or more DC power supplies. The electrical system may be a low voltage DC power distribution system. The fault may be selected from the group of a variable load, an earth fault, and a short circuit. The fault assembly may include at least one selected from the group of a variable load module, an earth fault module, a short circuit module, a variable power supply, and combinations thereof. The fault assembly may include a variable load module, an earth fault module, a short circuit module, and a variable power supply. The first measurement assembly and the second measurement assembly may be configured to provide pass through sensing of the one or more power supplies. The exemplary disclosed method may include a data storage configured to receive data from the first measurement assembly and the second measurement assembly, and a controller configured to compare any of the sensed first voltage or first current measured before, during, or after inducing the fault, the sensed second voltage or second current measured before, during, or after inducing the fault, or the sensed third voltage or third current measured before, during, or after inducing the fault with any other of the sensed first voltage or first current measured before, during, or after inducing the fault, the sensed second voltage or second current measured before, during, or after inducing the fault, or the sensed third voltage or third current measured before, during, or after inducing the fault. The exemplary disclosed apparatus may also include a controller that is configured to communicate with and control the first measurement assembly, the second measurement assembly, the power controller, a data storage, and a user interface.

In at least some exemplary embodiments, the exemplary disclosed method may be for testing an electrical system including one or more power supplies, a load, and one or more protective-isolation devices disposed between the one or more power supplies and the load. The exemplary disclosed method may include sensing a first voltage or a first current at an input side of the one or more power supplies, sensing a second voltage or a second current at an output side of the one or more power supplies, sensing a third voltage or a third current between the one or more protective-isolation devices and the load, selecting a fault from a plurality of fault types, inducing the fault to the output side of the one or more power supplies or a load side of the one or more protective-isolation devices, and comparing a first data of the first voltage or the first current sensing, a second data of the second voltage or the second current sensing, and a third data of the third voltage or the third current sensing. The method may include determining a pass or a fail of the electrical system based on comparing any of the sensed first voltage or first current measured before, during, or after inducing the fault, the sensed second voltage or second current measured before, during, or after inducing the fault, or the sensed third voltage or third current measured before, during, or after inducing the fault with any other of the sensed first voltage or first current measured before, during, or after inducing the fault, the sensed second voltage or second current measured before, during, or after inducing the fault, or the sensed third voltage or third current measured before, during, or after inducing the fault. The method may also include determining whether or not the fault has propagated to the input side of the one or more power supplies based on comparing the first data, the second data, and the third data. Inducing the fault to the output side of the one or more power supplies may include inducing a variable load using a variable power supply. Inducing the fault to the output side of the one or more power supplies may include inducing an earth fault. Inducing the fault to the output side of the one or more power supplies may include inducing a short circuit. The electrical system may be a low voltage DC power distribution system. The exemplary disclosed method may further include determining a pass or a fail of the electrical system based on comparing all of the sensed first voltage or first current measured before, during, and after inducing the fault, the sensed second voltage or second current measured before, during, and after inducing the fault, and the sensed third voltage or third current measured before, during, and after inducing the fault with each other.

In at least some exemplary embodiments, the exemplary disclosed method may include sensing a first voltage or a first current at an input side of a low voltage DC power distribution system having one or more DC power supplies, sensing a second voltage or a second current at an output side of the one or more DC power supplies, selecting a fault from a plurality of fault types, inducing the fault to the output side of the one or more DC power supplies, comparing a first data of the first voltage or the first current sensing to a second data of the second voltage or the second current sensing, and determining whether or not the fault has propagated to the input side of the one or more DC power supplies based on comparing the first data and the second data. Inducing the fault to the output side of the one or more DC power supplies may include using a fault assembly that includes a variable load module, an earth fault module, a short circuit module, and a variable power supply. Sensing the first voltage or the first current, sensing the second voltage or the second current, selecting the fault, inducing the fault, and comparing the first data to the second data may include using components housed in a single housing that is temporarily, permanently, or integrally electrically connected to the low voltage DC power distribution system.

The exemplary disclosed system, apparatus, and method may provide an efficient and effective technique for confirming fault isolation of an electrical system such as a DC electrical system. The exemplary disclosed system, apparatus, and method may confirm fault isolation without negatively affecting, altering an operation, or damaging equipment components of an electrical system being tested. The exemplary disclosed system, apparatus, and method may provide a repeatable, reliable, and efficient technique for confirming fault isolation of an electrical system such as a DC electrical system. The exemplary disclosed system, apparatus, and method may provide electrical system testing that does not expose personnel to unsafe conditions.

Figure 5:
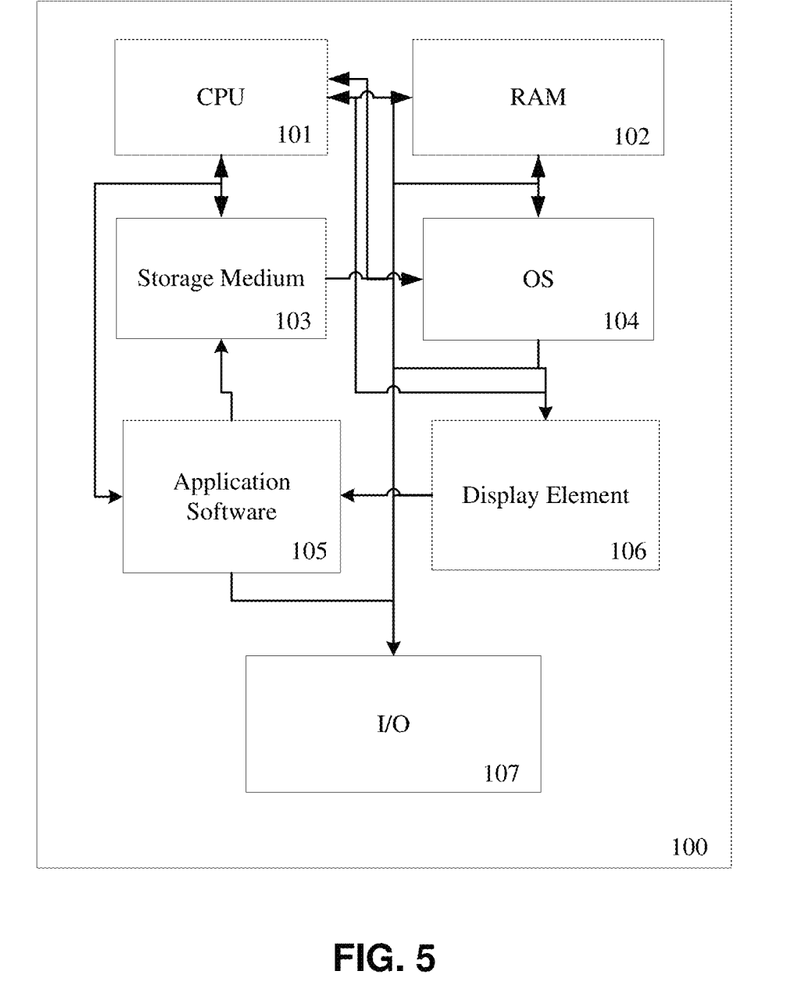
FIG. 5 is a schematic illustration of an exemplary computing device, in accordance with at least some exemplary embodiments of the present disclosure.

An illustrative representation of a computing device appropriate for use with embodiments of the system of the present disclosure is shown in FIG. 5. The computing device 100 can generally be comprised of a Central Processing Unit (CPU, 101), optional further processing units including a graphics processing unit (GPU), a Random Access Memory (RAM, 102), a mother board 103, or alternatively/additionally a storage medium (e.g., hard disk drive, solid state drive, flash memory, cloud storage), an operating system (OS, 104), one or more application software 105, a display element 106, and one or more input/output devices/means 107, including one or more communication interfaces (e.g., RS232, Ethernet, Wifi, Bluetooth, USB). Useful examples include, but are not limited to, personal computers, smart phones, laptops, mobile computing devices, tablet PCs, and servers. Multiple computing devices can be operably linked to form a computer network in a manner as to distribute and share one or more resources, such as clustered computing devices and server banks/farms.

Various examples of such general-purpose multi-unit computer networks suitable for embodiments of the disclosure, their typical configuration and many standardized communication links are well known to one skilled in the art, as explained in more detail and illustrated by FIG. 6, which is discussed herein-below.

According to an exemplary embodiment of the present disclosure, data may be transferred to the system, stored by the system and/or transferred by the system to users of the system across local area networks (LANs) (e.g., office networks, home networks) or wide area networks (WANs) (e.g., the Internet). In accordance with the previous embodiment, the system may be comprised of numerous servers communicatively connected across one or more LANs and/or WANs. One of ordinary skill in the art would appreciate that there are numerous manners in which the system could be configured and embodiments of the present disclosure are contemplated for use with any configuration.

In general, the system and methods provided herein may be employed by a user of a computing device whether connected to a network or not. Similarly, some steps of the methods provided herein may be performed by components and modules of the system whether connected or not. While such components/modules are offline, and the data they generated will then be transmitted to the relevant other parts of the system once the offline component/module comes again online with the rest of the network (or a relevant part thereof). According to an embodiment of the present disclosure, some of the applications of the present disclosure may not be accessible when not connected to a network, however a user or a module/component of the system itself may be able to compose data offline from the remainder of the system that will be consumed by the system or its other components when the user/offline system component or module is later connected to the system network.

Figure 6:
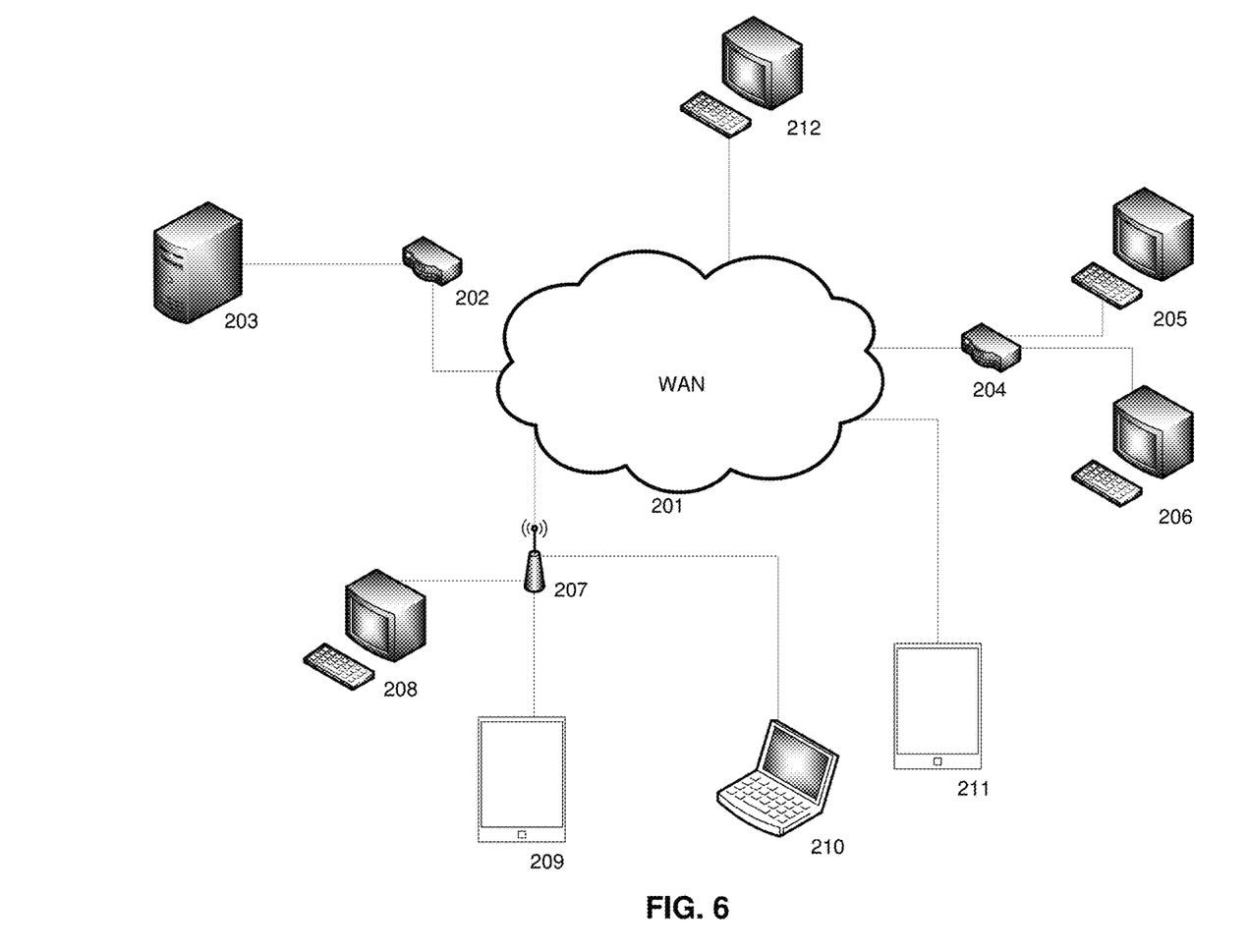
FIG. 6 is a schematic illustration of an exemplary network, in accordance with at least some exemplary embodiments of the present disclosure.

Referring to FIG. 6, a schematic overview of a system in accordance with an embodiment of the present disclosure is shown. The system is comprised of one or more application servers 203 for electronically storing information used by the system. Applications in the server 203 may retrieve and manipulate information in storage devices and exchange information through a WAN 201 (e.g., the Internet). Applications in server 203 may also be used to manipulate information stored remotely and process and analyze data stored remotely across a WAN 201 (e.g., the Internet).

According to an exemplary embodiment, as shown in FIG. 6, exchange of information through the WAN 201 or other network may occur through one or more high speed connections. In some cases, high speed connections may be over-the-air (OTA), passed through networked systems, directly connected to one or more WANs 201 or directed through one or more routers 202. Router(s) 202 are completely optional and other embodiments in accordance with the present disclosure may or may not utilize one or more routers 202. One of ordinary skill in the art would appreciate that there are numerous ways server 203 may connect to WAN 201 for the exchange of information, and embodiments of the present disclosure are contemplated for use with any method for connecting to networks for the purpose of exchanging information. Further, while this application refers to high speed connections, embodiments of the present disclosure may be utilized with connections of any speed.

Components or modules of the system may connect to server 203 via WAN 201 or other network in numerous ways. For instance, a component or module may connect to the system i) through a computing device 212 directly connected to the WAN 201, ii) through a computing device 205, 206 connected to the WAN 201 through a routing device 204, iii) through a computing device 208, 209, 210 connected to a wireless access point 207 or iv) through a computing device 211 via a wireless connection (e.g., CDMA, GMS, 3G, 4G, 5G) to the WAN 201. One of ordinary skill in the art will appreciate that there are numerous ways that a component or module may connect to server 203 via WAN 201 or other network, and embodiments of the present disclosure are contemplated for use with any method for connecting to server 203 via WAN 201 or other network. Furthermore, server 203 could be comprised of a personal computing device, such as a smartphone, acting as a host for other computing devices to connect to.

The communications means of the system may be any means for communicating data, including image and video, over one or more networks or to one or more peripheral devices attached to the system, or to a system module or component. Appropriate communications means may include, but are not limited to, wireless connections, wired connections, cellular connections, data port connections, Bluetooth® connections, near field communications (NFC) connections, or any combination thereof. One of ordinary skill in the art will appreciate that there are numerous communications means that may be utilized with embodiments of the present disclosure, and embodiments of the present disclosure are contemplated for use with any communications means.

Traditionally, a computer program includes a finite sequence of computational instructions or program instructions. It will be appreciated that a programmable apparatus or computing device can receive such a computer program and, by processing the computational instructions thereof, produce a technical effect.

A programmable apparatus or computing device includes one or more microprocessors, microcontrollers, embedded microcontrollers, programmable digital signal processors, programmable devices, programmable gate arrays, programmable array logic, memory devices, application specific integrated circuits, or the like, which can be suitably employed or configured to process computer program instructions, execute computer logic, store computer data, and so on. Throughout this disclosure and elsewhere a computing device can include any and all suitable combinations of at least one general purpose computer, special-purpose computer, programmable data processing apparatus, processor, processor architecture, and so on. It will be understood that a computing device can include a computer-readable storage medium and that this medium may be internal or external, removable and replaceable, or fixed. It will also be understood that a computing device can include a Basic Input/Output System (BIOS), firmware, an operating system, a database, or the like that can include, interface with, or support the software and hardware described herein.

Embodiments of the system as described herein are not limited to applications involving conventional computer programs or programmable apparatuses that run them. It is contemplated, for example, that embodiments of the disclosure as claimed herein could include an optical computer, quantum computer, analog computer, single board computer, microprocessor, microcontroller, programmable logic controller, field programmable gate array (FPGA), or the like.

Regardless of the type of computer program or computing device involved, a computer program can be loaded onto a computing device to produce a particular machine that can perform any and all of the depicted functions. This particular machine (or networked configuration thereof) provides a technique for carrying out any and all of the depicted functions.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Illustrative examples of the computer readable storage medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A data store may be comprised of one or more of a database, file storage system, relational data storage system or any other data system or structure configured to store data. The data store may be a relational database, working in conjunction with a relational database management system (RDBMS) for receiving, processing and storing data. A data store may comprise one or more databases for storing information related to the processing of moving information and estimate information as well one or more databases configured for storage and retrieval of moving information and estimate information.

Computer program instructions can be stored in a computer-readable memory capable of directing a computer or other programmable data processing apparatus to function in a particular manner. The instructions stored in the computer-readable memory constitute an article of manufacture including computer-readable instructions for implementing any and all of the depicted functions.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

The elements depicted in flowchart illustrations and block diagrams throughout the figures imply logical boundaries between the elements. However, according to software or hardware engineering practices, the depicted elements and the functions thereof may be implemented as parts of a monolithic software structure, as standalone software components or modules, or as components or modules that employ external routines, code, services, and so forth, or any combination of these. All such implementations are within the scope of the present disclosure. In view of the foregoing, it will be appreciated that elements of the block diagrams and flowchart illustrations support combinations of means for performing the specified functions, combinations of steps for performing the specified functions, program instruction technique for performing the specified functions, and so on.

It will be appreciated that computer program instructions may include computer executable code. A variety of languages for expressing computer program instructions are possible, including without limitation C, C++, Java, JavaScript, assembly language, Lisp, HTML, Perl, Python, and so on. Such languages may include assembly languages, hardware description languages, database programming languages, functional programming languages, imperative programming languages, and so on. In some embodiments, computer program instructions can be stored, compiled, or interpreted to run on a computing device, a programmable data processing apparatus, a heterogeneous combination of processors or processor architectures, and so on. Without limitation, embodiments of the system as described herein can take the form of web-based computer software, which includes client/server software, software-as-a-service, peer-to-peer software, or the like.

In some embodiments, a computing device enables execution of computer program instructions including multiple programs or threads. The multiple programs or threads may be processed more or less simultaneously to enhance utilization of the processor and to facilitate substantially simultaneous functions. By way of implementation, any and all methods, program codes, program instructions, and the like described herein may be implemented in one or more thread. The thread can spawn other threads, which can themselves have assigned priorities associated with them. In some embodiments, a computing device can process these threads based on priority or any other order based on instructions provided in the program code.

Unless explicitly stated or otherwise clear from the context, the verbs "process" and "execute" are used interchangeably to indicate execute, process, interpret, compile, assemble, link, load, any and all combinations of the foregoing, or the like. Therefore, embodiments that process computer program instructions, computer-executable code, or the like can suitably act upon the instructions or code in any and all of the ways just described.

The functions and operations presented herein are not inherently related to any particular computing device or other apparatus. Various general-purpose systems may also be used with programs in accordance with the teachings herein, or it may prove convenient to construct more specialized apparatus to perform the required method steps. The required structure for a variety of these systems will be apparent to those of ordinary skill in the art, along with equivalent variations. In addition, embodiments of the disclosure are not described with reference to any particular programming language. It is appreciated that a variety of programming languages may be used to implement the present teachings as described herein, and any references to specific languages are provided for disclosure of enablement and best mode of embodiments of the disclosure. Embodiments of the disclosure are well suited to a wide variety of computer network systems over numerous topologies. Within this field, the configuration and management of large networks include storage devices and computing devices that are communicatively coupled to dissimilar computing and storage devices over a network, such as the Internet, also referred to as "web" or "world wide web".

In at least some exemplary embodiments, the exemplary disclosed system may utilize sophisticated machine learning and/or artificial intelligence techniques to prepare and submit datasets and variables to cloud computing clusters and/or other analytical tools (e.g., predictive analytical tools) which may analyze such data using artificial intelligence neural networks. The exemplary disclosed system may for example include cloud computing clusters performing predictive analysis. For example, the exemplary neural network may include a plurality of input nodes that may be interconnected and/or networked with a plurality of additional and/or other processing nodes to determine a predicted result. Exemplary artificial intelligence processes may include filtering and processing datasets, processing to simplify datasets by statistically eliminating irrelevant, invariant or superfluous variables or creating new variables which are an amalgamation of a set of underlying variables, and/or processing for splitting datasets into train, test and validate datasets using at least a stratified sampling technique. The exemplary disclosed system may utilize prediction algorithms and approach that may include regression models, tree-based approaches, logistic regression, Bayesian methods, deep-learning and neural networks both as a standalone and on an ensemble basis, and final prediction may be based on the model/structure which delivers the highest degree of accuracy and stability as judged by implementation against the test and validate datasets.

Throughout this disclosure and elsewhere, block diagrams and flowchart illustrations depict methods, apparatuses (e.g., systems), and computer program products. Each element of the block diagrams and flowchart illustrations, as well as each respective combination of elements in the block diagrams and flowchart illustrations, illustrates a function of the methods, apparatuses, and computer program products. Any and all such functions ("depicted functions") can be implemented by computer program instructions; by special-purpose, hardware-based computer systems; by combinations of special purpose hardware and computer instructions; by combinations of general purpose hardware and computer instructions; and so on—any and all of which may be generally referred to herein as a "component", "module," or "system."

While the foregoing drawings and description set forth functional aspects of the disclosed systems, no particular arrangement of software for implementing these functional aspects should be inferred from these descriptions unless explicitly stated or otherwise clear from the context.

Each element in flowchart illustrations may depict a step, or group of steps, of a computer-implemented method. Further, each step may contain one or more sub-steps. For the purpose of illustration, these steps (as well as any and all other steps identified and described above) are presented in order. It will be understood that an embodiment can contain an alternate order of the steps adapted to a particular application of a technique disclosed herein. All such variations and modifications are intended to fall within the scope of this disclosure. The depiction and description of steps in any particular order is not intended to exclude embodiments having the steps in a different order, unless required by a particular application, explicitly stated, or otherwise clear from the context.

The functions, systems and methods herein described could be utilized and presented in a multitude of languages. Individual systems may be presented in one or more languages and the language may be changed with ease at any point in the process or methods described above. One of ordinary skill in the art would appreciate that there are numerous languages the system could be provided in, and embodiments of the present disclosure are contemplated for use with any language.

While multiple embodiments are disclosed, still other embodiments of the present disclosure will become apparent to those skilled in the art from this detailed description. There may be aspects of this disclosure that may be practiced without the implementation of some features as they are described. It should be understood that some details have not been described in detail in order to not unnecessarily obscure the focus of the disclosure. The disclosure is capable of myriad modifications in various obvious aspects, all without departing from the spirit and scope of the present disclosure. Accordingly, the drawings and descriptions are to be regarded as illustrative rather than restrictive in nature.

What is claimed is:

1. An apparatus configured to test an electrical system including one or more power supplies, a load, and one or more protective-isolation devices disposed between the one or more power supplies and the load, comprising:
   a first measurement assembly configured to sense a first voltage or a first current at an input side of the one or more power supplies;
   a second measurement assembly configured to sense a second voltage or a second current at an output side of the one or more power supplies, and a third voltage or a third current between the one or more protective-isolation devices and the load; and
   a power controller electrically disposed between the second or third measurement assembly and a fault assembly;
   wherein the fault assembly and the power controller are configured to selectively induce a fault, which is selected from a plurality of fault types, either to the output side of the electrical system or between the one or more protective-isolation devices and the load; and
   wherein the second measurement assembly is electrically connected between the one or more protective-isolation devices and the load to sense the third voltage.

2. The apparatus of claim 1, wherein the one or more power supplies are one or more DC power supplies.

3. The apparatus of claim 1, wherein the electrical system is a low voltage DC power distribution system.

4. The apparatus of claim 1, wherein the fault is selected from the group of a variable load, an earth fault, and a short circuit.

5. The apparatus of claim 1, wherein the fault assembly includes at least one selected from the group of a variable load module, an earth fault module, a short circuit module, a variable power supply, and combinations thereof.

6. The apparatus of claim 1, wherein the fault assembly includes a variable load module, an earth fault module, a short circuit module, and a variable power supply.

7. The apparatus of claim 1, wherein the first measurement assembly and the second measurement assembly are configured to provide pass through sensing of the one or more power supplies.

8. The apparatus of claim 1, further comprising a data storage configured to receive data from the first measurement assembly and the second measurement assembly, and a controller configured to compare any of the sensed first voltage or first current measured before, during, or after inducing the fault, the sensed second voltage or second current measured before, during, or after inducing the fault, or the sensed third voltage or third current measured before, during, or after inducing the fault with any other of the sensed first voltage or first current measured before, during, or after inducing the fault, the sensed second voltage or second current measured before, during, or after inducing the fault, or the sensed third voltage or third current measured before, during, or after inducing the fault.

9. The apparatus of claim 1, further comprising a controller that is configured to communicate with and control the first measurement assembly, the second measurement assembly, the power controller, a data storage, and a user interface.

10. A method for testing an electrical system including one or more power supplies, a load, and one or more protective-isolation devices disposed between the one or more power supplies and the load, comprising:
   sensing a first voltage or a first current at an input side of the one or more power supplies;
   sensing a second voltage or a second current at an output side of the one or more power supplies;
   sensing a third voltage or a third current between the one or more protective-isolation devices and the load based on electrically connecting a measurement assembly between the one or more protective-isolation devices and the load;
   selecting a fault from a plurality of fault types;
   inducing the fault to the output side of the one or more power supplies or a load side of the one or more protective-isolation devices; and
   comparing a first data of the first voltage or the first current sensing, a second data of the second voltage or the second current sensing, and a third data of the third voltage or the third current sensing.

11. The method of claim 10, further comprising determining a pass or a fail of the electrical system based on comparing any of the sensed first voltage or first current measured before, during, or after inducing the fault, the sensed second voltage or second current measured before, during, or after inducing the fault, or the sensed third voltage or third current measured before, during, or after inducing the fault with any other of the sensed first voltage or first current measured before, during, or after inducing the fault, the sensed second voltage or second current measured before, during, or after inducing the fault, or the sensed third voltage or third current measured before, during, or after inducing the fault.

12. A method, comprising:
sensing a first voltage or a first current at an input side of a low voltage DC power distribution system having one or more DC power supplies based on removably electrically connecting a portable testing apparatus to the input side of the one or more DC power supplies;
sensing a second voltage or a second current at an output side of the one or more DC power supplies based on removably electrically connecting the portable testing apparatus to the output side of the one or more DC power supplies;
selecting a fault from a plurality of fault types;
inducing the fault to the output side of the one or more DC power supplies;
comparing a first data of the first voltage or the first current sensing to a second data of the second voltage or the second current sensing; and
determining whether or not the fault has propagated to the input side of the one or more DC power supplies based on comparing the first data and the second data.

13. The method of claim 12, wherein inducing the fault to the output side of the one or more DC power supplies includes using a fault assembly that includes a variable load module, an earth fault module, a short circuit module, and a variable power supply.

14. The method of claim 12, wherein sensing the first voltage or the first current, sensing the second voltage or the second current, selecting the fault, inducing the fault, and comparing the first data to the second data includes using components housed in a single housing of the portable testing apparatus that is temporarily electrically connected to the low voltage DC power distribution system.

15. The apparatus of claim 1, wherein the first measurement assembly is removably electrically connectable to the input side of the one or more power supplies.

16. The apparatus of claim 1, wherein the second measurement assembly is:
removably electrically connectable to the output side of the one or more power supplies; and
removably electrically connectable between the one or more protective-isolation devices and the load.

17. The apparatus of claim 1, further comprising a testing apparatus housing, wherein the first measurement assembly, the second measurement assembly, the power controller, and the fault assembly are disposed in the testing apparatus housing that is portable.

18. The apparatus of claim 1, wherein the apparatus is a portable testing apparatus including the first measurement assembly, the second measurement assembly, the power controller, and the fault assembly.

19. The apparatus of claim 18, wherein the first measurement assembly is removably electrically connectable to the input side of the one or more power supplies.

20. The apparatus of claim 18, wherein:
the second measurement assembly is removably electrically connectable to the output side of the one or more power supplies; and
the second measurement assembly is removably electrically connectable between the one or more protective-isolation devices and the load.

* * * * *